(12) United States Patent
McConaghy et al.

(10) Patent No.: US 7,761,834 B2
(45) Date of Patent: Jul. 20, 2010

(54) INTERACTIVE SCHEMATIC FOR USE IN ANALOG, MIXED-SIGNAL, AND CUSTOM DIGITAL CIRCUIT DESIGN

(75) Inventors: Trent Lorne McConaghy, Beatty (CA); Kristopher Breen, Saskatoon (CA); Amit Gupta, Edmonton (CA); David Callele, Saskatoon (CA); Jeffrey Dyck, Saskatoon (CA); Charles Cazabon, Regina (CA); Joel Cooper, Saskatoon (CA); Shawn Rusaw, Saskatoon (CA)

(73) Assignee: Solido Design Automation Inc., Saskatoon, Saskatchewan (CA)

( * ) Notice: Subject to any disclaimer, the term of this patent is extended or adjusted under 35 U.S.C. 154(b) by 432 days.

(21) Appl. No.: 11/780,039

(22) Filed: Jul. 19, 2007

(65) Prior Publication Data

US 2008/0022251 A1   Jan. 24, 2008

Related U.S. Application Data

(60) Provisional application No. 60/807,883, filed on Jul. 20, 2006.

(51) Int. Cl.
*G06F 17/50* (2006.01)

(52) U.S. Cl. .................. 716/11; 716/1; 716/2; 716/8

(58) Field of Classification Search .............. 716/1, 716/8, 11, 2
See application file for complete search history.

(56) References Cited

U.S. PATENT DOCUMENTS

| 5,673,198 | A | * | 9/1997 | Lawman et al. | 716/11 |
| 5,787,268 | A | * | 7/1998 | Sugiyama et al. | 716/11 |
| 6,968,517 | B2 | * | 11/2005 | McConaghy | 716/2 |

OTHER PUBLICATIONS

G. Gielen et al., "Computer Aided Design of Analog and Mixed-Signal Integrated Circuits", Proceedings Of The IEEE, Dec. 2000, vol. 88, No. 12, pp. 1825-1852.
William Frawley et al., "Knowledge Discovery in Databases: An Overview", AI Magazine, ISSN 0738-4602, pp. 213-228.

* cited by examiner

*Primary Examiner*—Sun J Lin
(74) *Attorney, Agent, or Firm*—Louis B. Allard; Borden Ladner Gervais LLP

(57) ABSTRACT

For application to analog, mixed-signal, and custom digital circuits, a system and method to improve the flow of setting up a set of simulations, a characterization, or optimization problem via an interactive circuit schematic. A system and method to visualize circuit simulation data in which at least one of the views is an enhanced, interactive schematic view.

15 Claims, 14 Drawing Sheets

INTERACTIVE SCHEMATIC FOR USE IN ANALOG, MIXED-SIGNAL, AND CUSTOM DIGITAL CIRCUIT DESIGN

This application claims the benefit of priority of U.S. Provisional Patent Application No. 60/807,883 filed Jul. 20, 2006, which is incorporated herein by reference. The applicant acknowledges the participation of K. U. Leuven Research and Development in the development of this invention.

FIELD OF THE INVENTION

The present invention relates generally to analog, mixed-signal, and custom digital circuit design tools. More particularly, the present invention relates to interactive and/or annotated schematics for visualization in analog circuit design and optimization tools.

BACKGROUND OF THE INVENTION

Software tools are frequently used in the design of analog, mixed-signal and custom digital circuits. In the front-end stage of a design, where yield is the primary concern, designers must choose device sizes and other parameters such that the maximum possible percentage of manufactured chips meets all pre-determined specifications, i.e., such that the yield is maximized. In order to effectively design such circuits, designers often need some insight into the design, the insight not necessarily being apparent from the circuit schematic alone. Designers tend to gain insight into the circuit design by viewing representations of the circuit schematic and its underlying topology. Currently, there are schematic editors/viewers for viewing circuit schematics as well as tools for visualization of analog circuit optimization and characterization data; however, these tools do not readily interoperate and the designer has to switch back and forth from one to the other in order to set up a characterization or optimization run, or gather insight in different ways such as, for example, by visualizing transient simulation waveforms or the results of a parameter sweep.

Visualization tools for electrical circuits can be thought of as being in a technological field of their own because of the value that good visualization of data can provide in terms of verifying assumptions or hypotheses, aiding intuition, uncovering new knowledge and providing new perspectives leading to fresh thinking. For circuit design, good visualization tools can translate to more efficient designers, higher yield, better performing designs and faster time-to-market. For complex circuits having highly multidimensional datasets, such visualization tools are often indispensable. Another feature of good visualization tools is domain-specific visualization allowing users to get the most from available raw data. In terms of visualizing data in the analog and mixed-signal design domain, existing state of the art visualizations are standard textbook visualizations, such as, for example, two-dimensional (2D) and three-dimensional (3D) scatter plots, bar charts and histograms with variables including design variables, random variables, environmental variables, performance metrics and, sometimes, variables that aggregate, for example, performance metrics such as "worst case" performance metrics, partial yields, and overall yields. There is also "waveform viewing" that displays one or more signals as a function of time. However, as explained below, even though visualization tools have greatly improved over the years, there is still there is still a need to provide new ways for designers to explore data, especially new domain-specific ways.

Current circuit design visualization tools are not geared towards circuit design optimization and/or characterization. Even though designers usually think in terms of circuit schematics, existing optimizer and characterizer setup tools tend to be oriented towards textually dense tables requiring repetitive and lengthy data input, not towards circuit schematics per se. Further, current schematic editors are not made for setting and storing optimization variables, and characterization variables. For example, when a designer sets up, in an optimizer, minimum (min) and maximum (max) ranges for each design variable, the optimizer provides a table to fill in, with one row per variable. To properly set the min and max values, the designer must switch to a separate view of the schematic, and locate the element in question (typically, this is accomplished by manually scanning the schematic for the element name). The iterative process involved is: (a) obtain the name of the device related to variable, (b) scan the schematic to find the device with that name, (c) determine the appropriate min and max values while looking at schematic, and (d) return to the table and enter the min and max values. Needless to say that such processes are very time-consuming. Thus, there is clearly a need for a visualization tool that would allow various possible visual representations of fundamentally inter-related particulars of a circuit design in order to expedite processes such as, for example, optimization and/or characterization runs of circuit designs.

Therefore, it is desirable to reduce the time taken in setting up an optimization or characterization problem by breaking the iterative process of jumping back and forth between the schematic and the data entry table. It is also desirable to provide methods for displaying multidimensional circuit data, which is typically the result of an optimization or characterization run, such that designers gain more insight, and/or insight more quickly, with respect to a given circuit design.

SUMMARY OF THE INVENTION

It is an object of the present invention to obviate or mitigate at least one disadvantage of previous visualization tools used in analog, mixed-signal or custom digital circuit design and/or optimization.

In a first aspect of the invention, there is provided a method of interactive circuit design visualization. The method comprises a step of integrating a schematic of an electrical circuit and design particulars of the electrical circuit, the electrical circuit including components and being associated with variables, the design particulars including at least one of (1) operating ranges of the components, (2) performance data of the components, (3) performance data of the electrical circuit design, (4) yield data of the electrical circuit design, (5) data entry fields for the components, and (6) simulation data associated with the electrical circuit design. Further, the method comprises a step of displaying the schematic with the components in a circuit schematic view and the design particulars in a design particulars view. Additionally, the method comprises a step of, in response to selection by a user of a component in the circuit schematic view, interactively highlighting a corresponding design particular in the design particulars view.

The step of displaying the schematic in the circuit schematic view can include displaying an indication of an impact of at least one component on at least one of a yield of the design of the electrical circuit and a performance of the design of the electrical circuit. Further, the step of displaying the schematic can include displaying the indication of the impact through graphic marking of the at least one component of the electrical circuit. Further yet, the step of displaying the indication of the impact of the at least one component can include applying a color scheme with different colors corresponding to pre-determined values of the impact. Additionally, at least one graphically-marked component can include a hierarchy function selectable by a user to display information on sub-components of the at least one graphically-marked component.

Alternatively, the step of displaying the schematic in the circuit schematic view can includes displaying an indication of an impact of at least one variable on at least one of a yield of the design of the electrical circuit and a performance of the design of the electrical circuit.

Alternatively, the step of displaying the schematic in the circuit schematic view can includes displaying an indication of a sensitivity of at least one component on at least one of a yield of the design of the electrical circuit and a performance of the design of the electrical circuit. Further, the step of displaying the schematic can include displaying the indication of the impact through graphic marking of the at least one component of the electrical circuit. Further yet, displaying the indication of the sensitivity of the at least one component can include applying a color scheme with different colors corresponding to pre-determined values of the sensitivity. Additionally, at least one graphically-marked component can include a hierarchy function selectable by a user to display information on sub-components of the at least one graphically-marked component.

Alternatively, the step of displaying the schematic in the circuit schematic view can include displaying an indication of a sensitivity of at least one variable on at least one of a yield of the design of the electrical circuit and a performance of the design of the electrical circuit.

Alternatively, the design particulars view includes at least one item with statistical data relating at least one component of the electrical circuit to the yield of the design of the electrical circuit. Further, the statistical data can include at least one of a histogram, a scatter plot and a yield curve.

Alternatively, the circuit schematic view can includes a view of the schematic of the electrical circuit with at least one component of the electrical circuit, the at least one component being graphically-marked and associated with at least one of an optimization function and a characterization function, the step of interactively highlighting a corresponding design particular in the design particulars view including a step of performing at least one of an optimization and a characterization of the graphically-marked component.

Alternatively, the method of the first aspect can comprise a step of, in response to selection by a user of a design particular in the design particulars view, interactively highlighting at least one corresponding component in the circuit schematic view.

In a second aspect of the invention, there is provided an interactive electrical circuit design visualization system, the electrical circuit design having components and being associated with variables. The visualization system comprises a circuit schematic module including a schematic of the electrical circuit design. The visualization system also comprises a circuit particulars module including design particulars of the electrical circuit design, the design particulars including at least one of (1) operating ranges of the components, (2) performance data of the components, (3) performance data of the electrical circuit design, (4) yield data of the electrical circuit design, (5) data entry fields for the components, and (6) simulation data associated with the electrical circuit design. Further, the visualization system comprises an integration module operatively connected to the circuit schematic module and to the circuit particulars module, the integration module for integrating the schematic of the electrical circuit design with the design particulars to form enhanced schematic data. Further yet, the visualization system comprises a display system operatively connected to the integration module to display the enhanced schematic data as a circuit schematic view and design particulars view. Additionally, the visualization system comprises a user input module for selecting a component in the circuit schematic view to highlight interactively at least one corresponding design particular in the design particulars view. The user input module can further be for selecting a design particular in the design particulars view to highlight interactively at least one corresponding component in the schematic view.

According to various embodiments, the present invention provides a visualization system that can display simultaneously, and interactively, a circuit schematic view and a related design particulars view, the particulars including, for example, statistical information relating to the circuit, characterization variables and optimization variables. As used herein, an "interactive schematic" is a schematic whose display reflects interactions and/or relationships between components of a given electrical circuit and/or information contained in the visualization system. The interactive schematic may include graphic markings representing circuit information not usually found on a schematic diagram, such information including, for example, the impact (or relative impact) per device on yield. The tool may have user-controllable graphic user interface (GUI) elements that alter the information displayed and/or circuit information in an underlying database, such information including, for example, circuit simulation data.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein:

FIG. 2b shows the bar chart view of FIG. 2a;

FIG. 2c shows the schematic view of FIG. 2a;

FIG. 3b shows a schematic view related to the building block editor view of FIG. 3a;

FIG. 4b shows a schematic view related to the building block editor view of FIG. 4a;

FIG. 5b shows a schematic view related to the scatter plots of FIG. 5a;

DETAILED DESCRIPTION

Generally, the present invention is directed to a method and system for providing interactive circuit design visualization. According to embodiments of the invention, an interactive electrical circuit design visualization system displays a circuit schematic view and a design particulars view, which includes information on the particulars of the electrical circuit design in question. The system allows for the selection of an item in one of view to highlight a corresponding item in the other view. This interactive visualization system allows a designer to function much more efficiently than with prior art systems where circuit schematic views and design particulars views were independent.

Figure 1:
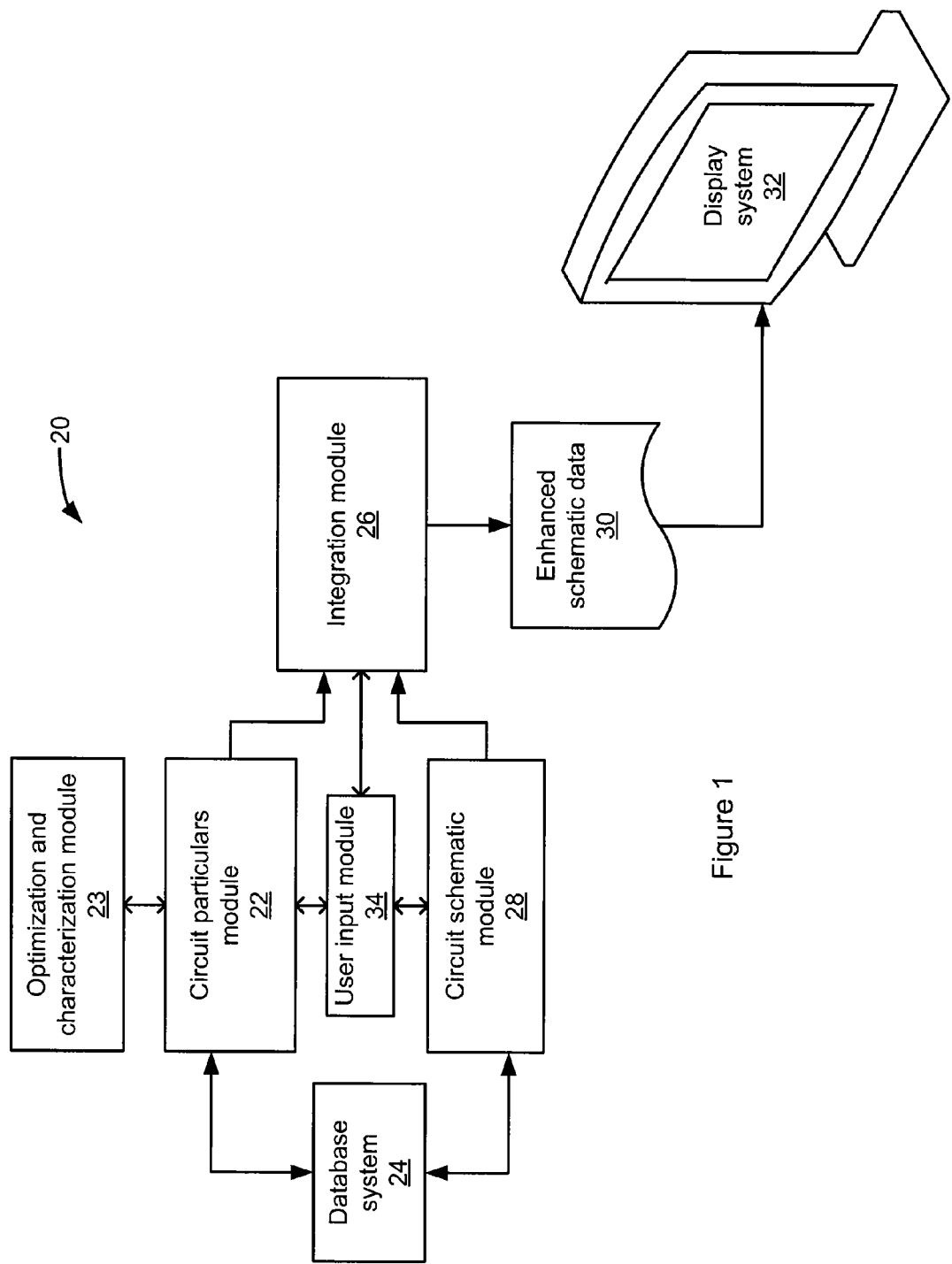
FIG. 1 is a block diagram of a visualization system according to the present invention.

FIG. 1 shows an exemplary embodiment of a visualization system 20 of the present invention. A circuit particulars module 22 contains particulars of a given electrical circuit design, the particulars including, for example, (1) operating ranges of components of the electrical circuit design, (2) performance data of the components, (3) performance data of the electrical circuit design, (4) yield data of the electrical circuit design, (5) data entry fields for the components, and (6) simulation data associated with the electrical circuit design. The circuit particulars module 22 can be in communications with an optimization and characterization (OC) module 23, through any suitable means, to perform optimization and/or characterization operations on the particulars of the given electrical circuit design. One such optimization can be, for example, an optimization of manufacturing yield of the electrical circuit in question. The circuit particulars module 22 can also be in communication with a database system 24 to extract circuit particulars associated with the given circuit design. The circuit particulars module 22 can also be used to populate the database system 24 with electrical circuit design data of the circuit design in question. Populating the database system 24 can be done, for example, following an optimization and/or characterization run, by the OC module 23. As will be understood by a worker having ordinary skilled in the art, other combinations of modules can be made to achieve visualization systems equivalent to that shown at FIG. 1.

The particulars contained in the database system 24 are typically related to circuit components and variables of the given electrical circuit design; however, the particulars can also be related to more evolved circuit characteristics, for example, aggregated data regarding yield, as will be discussed below. The circuit particulars module 22 is connected to an integration module 26 to which it provides particulars of the electrical circuit design. A circuit schematic module 28, containing information relating to the schematic of the given electrical circuit, is connected to the integration module 26 to which it provides schematic-related information. The circuit schematic module 28 can also be in communication with the database system 24 to extract schematic data of the electrical circuit design in question. The integration module 26 integrates the circuit particulars provided by the circuit particulars module 22, with the schematic data provided by the circuit schematic module to form enhanced schematic data 30 for display by the display system 32 as a circuit schematic view and a design particulars view as will be discussed further below. The circuit schematic module 26 can also be used to populate the database system 24 with schematic data of the circuit design in question.

The visualization system 20 further includes a user input module 34 connected to the integration module 26 in order to select one or more items displayed by the display system 32. The user input module 34 can also be connected to the circuit particulars module 22 and to the circuit schematic module 28 to input data to the circuit particulars module 22 and to the circuit schematic module 28 respectively. The user input module 34 can include, for example, a pointing device, a keyboard, a tactile display or any other suitable type of user input device.

In one embodiment of the present invention, the visualization system 20 enables a designer to see more than one view of the circuit data at once. In such an embodiment, the display shows a circuit schematic view and a design particulars view. The visualization system 20 exploits the underlying database system 24 of FIG. 1, that contains information about the schematic, and other information related to the particulars of the circuit design, such as, for example, identification of the circuit elements (components), the circuit specifications, the relationships between circuit elements and specifications, and the variables associated with each element. This information can be synthesized or analyzed, and viewed in many formats, such as, for example, bar charts, scatter plots, yield curves, etc. Information can be viewed according to single circuit elements, to groups of circuit elements or to the overall circuit. The visualization system 20 can display this data simultaneously with (a) the circuit design schematic, possibly annotated or otherwise marked-up with information from the database, and (b) at least one other view showing information related to the schematic.

Figure 2A:
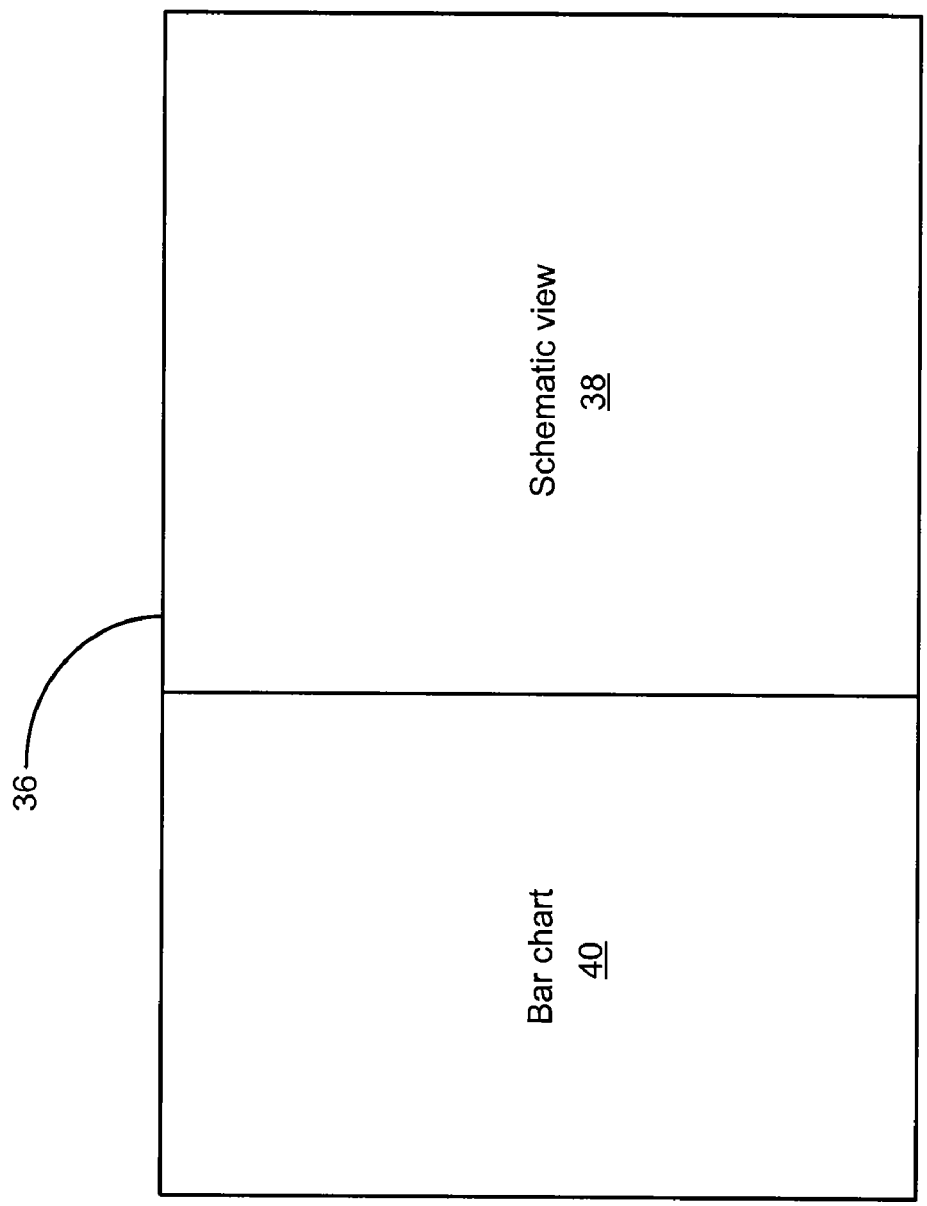
FIG. 2a shows a displayed view according to an embodiment of the present invention.
Figure 2B:
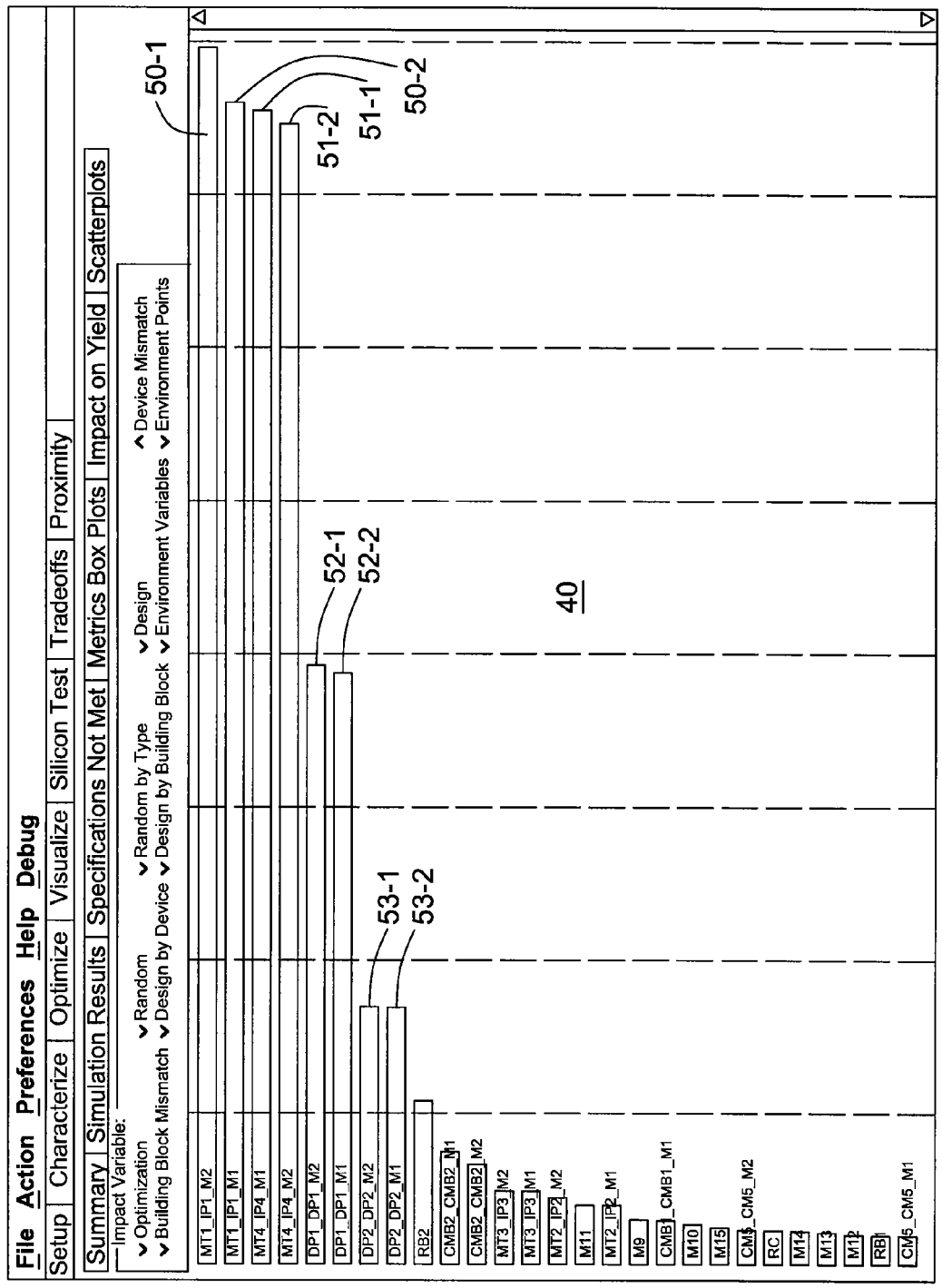

FIG. 2a shows an exemplary view 36 with a schematic view 38 on the right, and a bar chart 40 on the left. Even though the schematic view 38 and the bar chart 40 are shown side by side, they can be shown in any other suitable manner. The schematic view 38 is shown in detail at FIG. 2c and the bar chart 40 is shown in detail at FIG. 2b. Individual transistors of a given circuit design are represented in the schematic view 38. As determined through simulations and/or statistical analysis performed by the OC module 23, the impact on manufacturing yield of each transistor can be represented in the schematic view 38 by highlighting the transistors having the greatest impact on yield in a bright color and the other transistors in successive paler shades of the same color or, as will be understood by a worker having ordinary skill in the art, by any other suitable graphical scheme using, for example, colors, highlighting, cross-hatching etc. The bar chart 40 gives precise values and a visual representation of the impact on yield for each individual element. The transistors 50-1, 50-2, 51-1, 51-2, 52-1, 52-2, 53-1 and 53-2 shown in the schematic view 38 have their respective impact on yield represented with corresponding reference numerals in the bar chart 40 of FIG. 2b. There is a variety of information that can be reported similarly, including, for example: (a) yield (shown), or a performance measures such as, e.g., power consumption, gain, or slew rate; (b) nonlinear impact across a region (shown), or sensitivity/gradient about a point; (c) effects due to mismatch/random variation (shown), design/optimization variables, environmental variables such as temperature or load conditions, or proximity variables such as well spacing; (d) plot type such as bar chart (shown), 2D scatter plot where the y axis is impact and x axis is variable name, etc.

Thus, interactive schematics according to the present invention can be used for studying the performance of a given circuit, such as by exploring optimization and/or characterization results of the circuit in question. A schematic view of the circuit, for example, the schematic view 38, can be used to gain insight into the circuit. To do this, the schematic view 38 can be made to interact with circuit particulars in many ways.

Figure 2C:
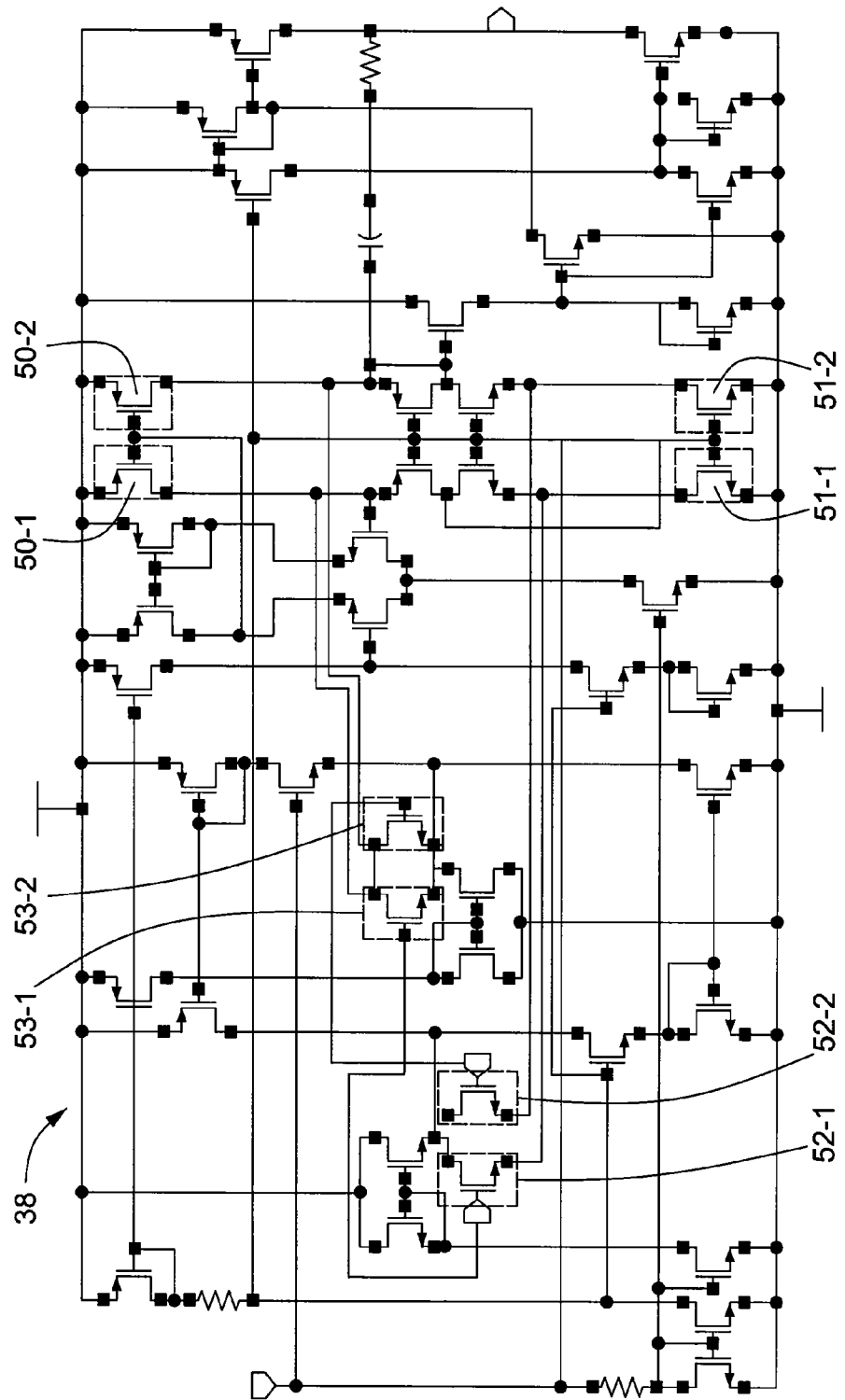

For example, (a) when the circuit particulars include circuit simulation data obtained through, for example, a simulation software such as SPICE, which can run in the OC module 23, the circuit simulation data can be represented directly on the schematic view 38 through annotation or any other suitable graphical marking of the schematic view 38, as seen at FIG. 2c; (b) the view 36 can also be used as a means to select data, seen in another view shown by the display system 32, through the user input module 34; (c) data shown or listed in one view, for example the bar chart 40, can be used to select items on the schematic view 38, again through the user input module 34 (for example, upon the user selecting a device, say transistor 50-1 in the schematic view 38, the corresponding bar of the bar chart 40 becomes highlighted or otherwise graphically differentiated from the other bars of the bar chart 40—this is sometimes termed as an interactive cross-referencing capability); and (d) data shown on the schematic view 38 or bar chart 40 can be used to select what is shown on a subsequent schematic view, i.e., there can be interactive exploration directly on the schematic.

Figure 3A:
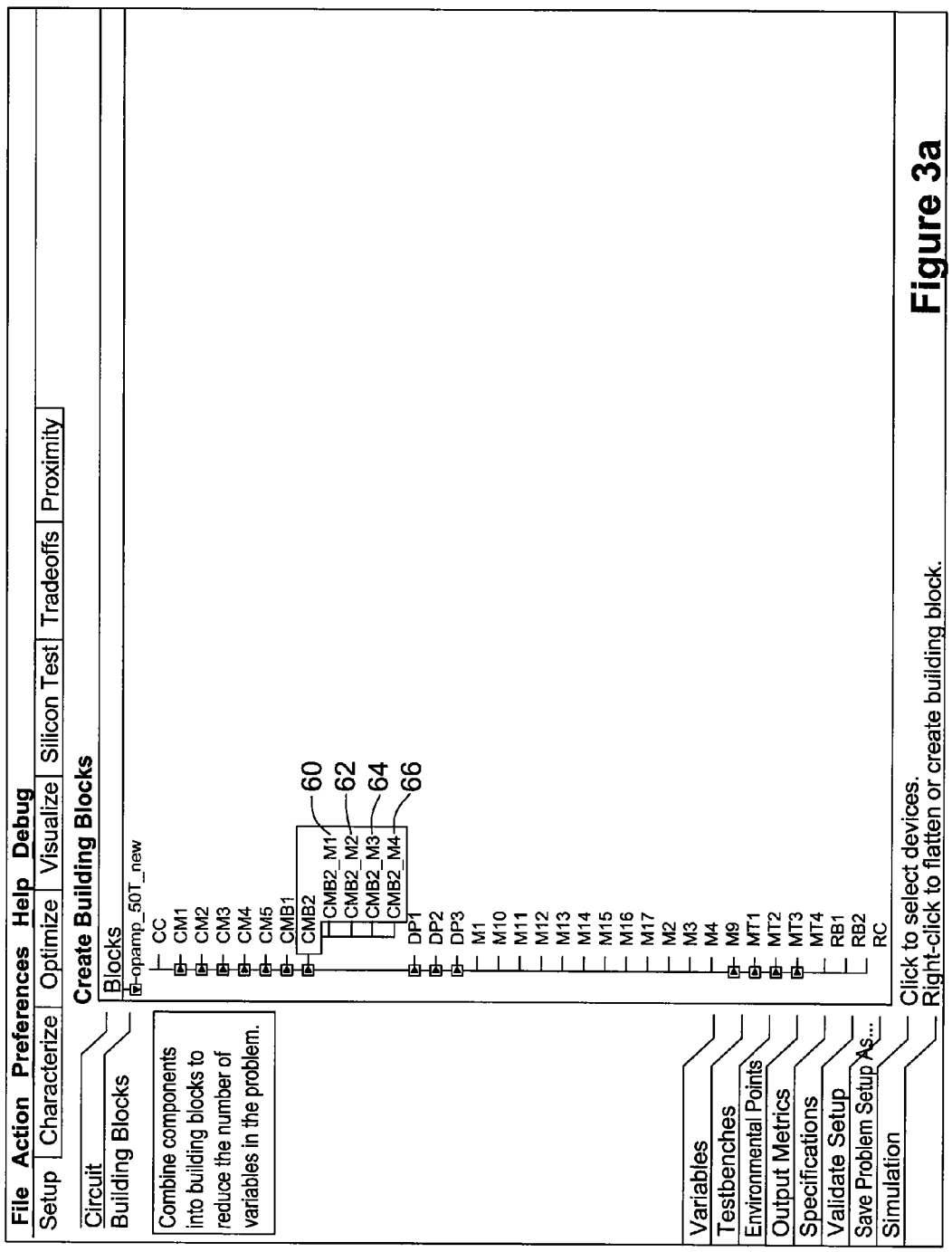
FIG. 3a shows a building block editor view used to define building blocks according to an embodiment of the present invention.
Figure 3B:
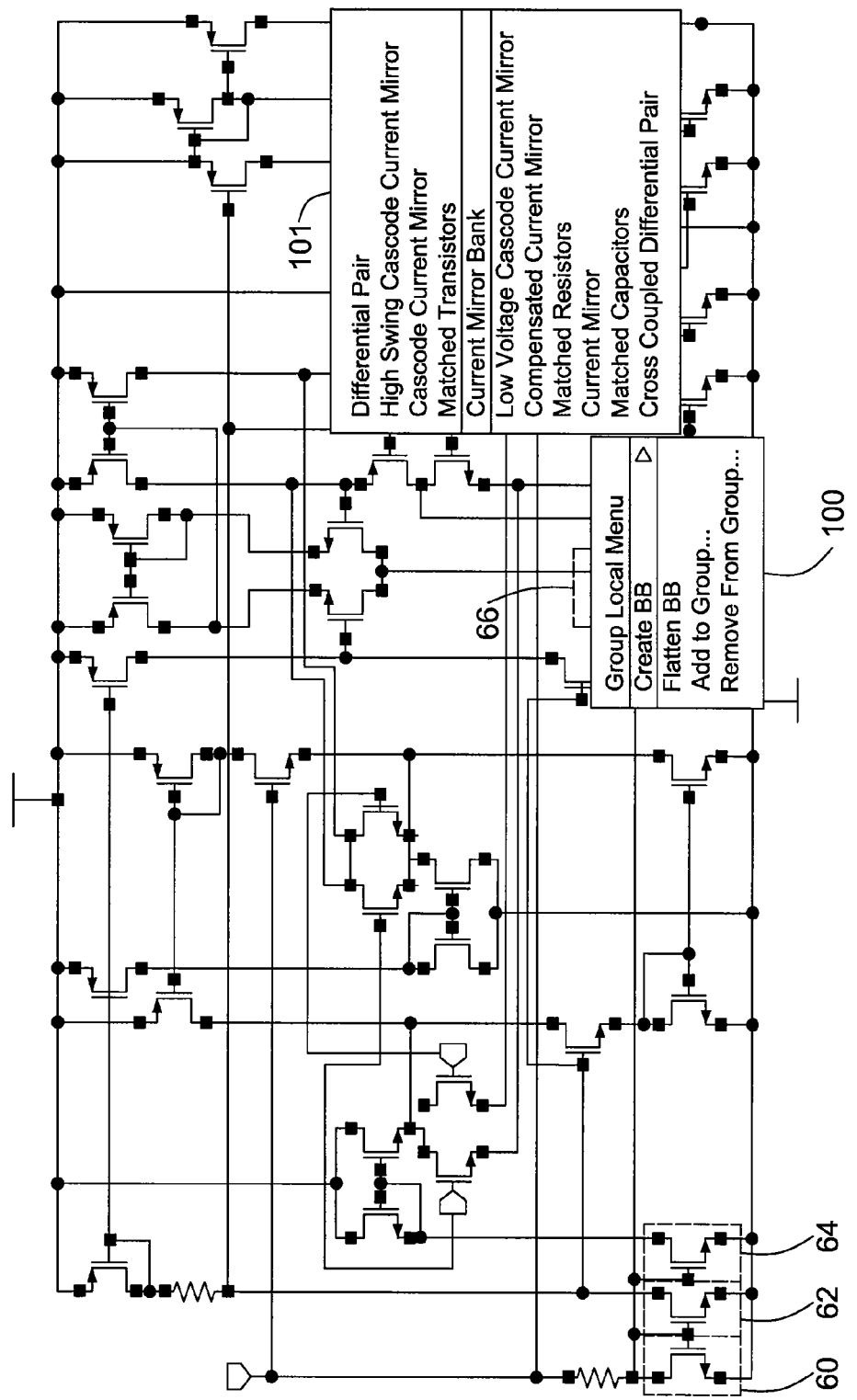

FIGS. 3a and 3b, which can be displayed simultaneously to the user such as at FIG. 2a, show another type of interactive cross-referencing capability where electrical building blocks can be created by the user interacting with the schematic to select a group of components. Here, the transistors shown at reference numerals 60, 62, 64 and 66 are selected by the user who then brings up a context menu to select the type of building block to be associated with these transistors. The user can select an element on the schematic of FIG. 3b, for example transistor 66, right-click and choose "setup device" to bring up a small table or box (e.g., 100 and 101) containing just the variables for that device. If it is a design variable, the table can include: min value, max value and an enable option for the design variable. In another example, the designer can click on a variable name in the table view, to change the min/max values. The corresponding device in the schematic is then automatically highlighted and becomes visible to the designer. This can also work in reverse: the designer can click on an element, and one or more of the variables in the main table view can become highlighted, or only those variables applicable to the selected element are shown.

As an example of building block setup, a user can select a group of devices on the schematic, and then select a building block name or type from a displayed candidate set of building block names that is most appropriate to the building block. The system can then tag those devices as a building block with its own constraints. FIGS. 3a and 3b show how selecting a component in the building blocks editor of FIG. 3a highlights the corresponding component in the schematic view of FIG. 3b (shown using rectangles). This serves as a visual confirmation to the designer that the correct building block is selected and reduces the time required to complete building block setup. Further, building blocks can be created by interacting with the schematic by selecting a group of components and then bringing up a context menu to select the type of building block. Instead of choosing a given building block name, the user can select "define new building block" and then enter the name for that building block, and also, possibly, new constraints for that building block. Using the present visualization tool for optimization and/or characterization problem setup eliminates the iterative process of transiting between the table and the schematic.

Figure 4A:
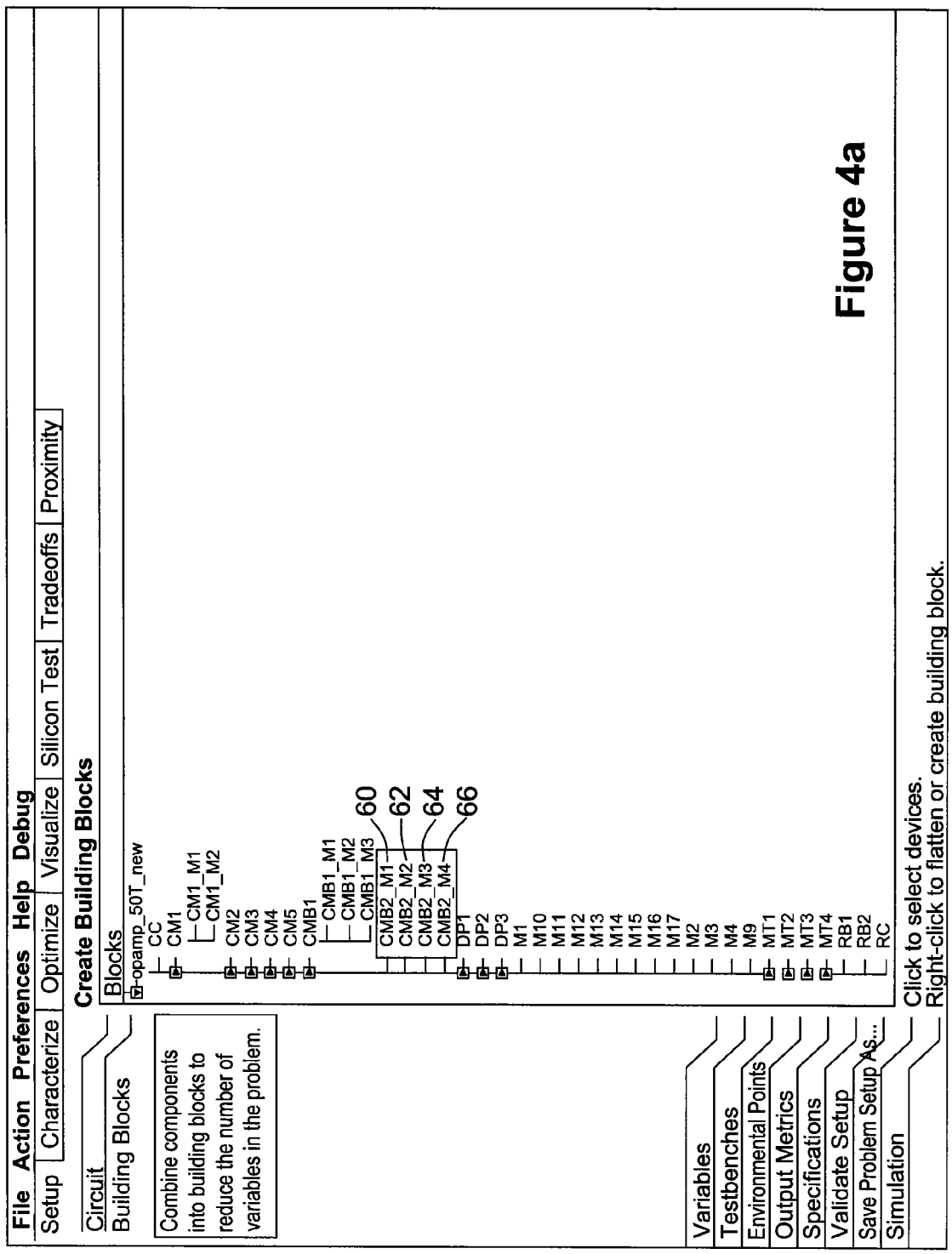
FIG. 4a shows a building block editor view used to select components according to an embodiment of the present invention.
Figure 4B:
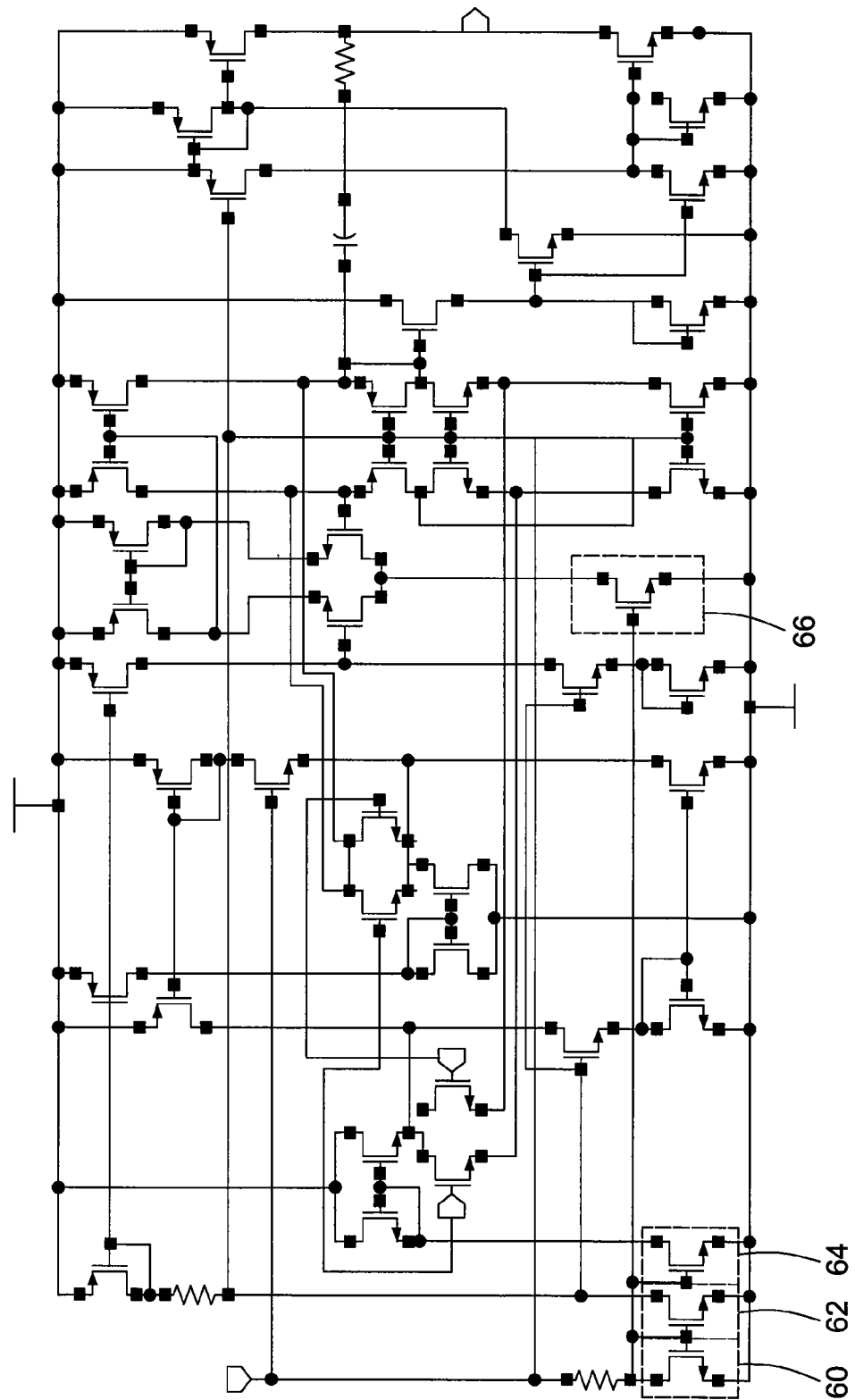

FIGS. 4a and 4b, which can also be displayed simultaneously to the user such as in FIG. 2a, show another type of interactive cross-referencing capability. The selection by a user of a building block, or of components of a building block, in FIG. 4a interactively represents the selected items in the electrical circuit design of FIG. 4b. Conversely, the selection of transistors in FIG. 4b can result in an interactive representation of the transistors in FIG. 4a. Transistors 60, 62, 64 and 66 are represented in FIGS. 4a and 4b. For sake of clarity, other components listed at FIG. 4a are not identified in FIG. 4b.

Figure 5A:
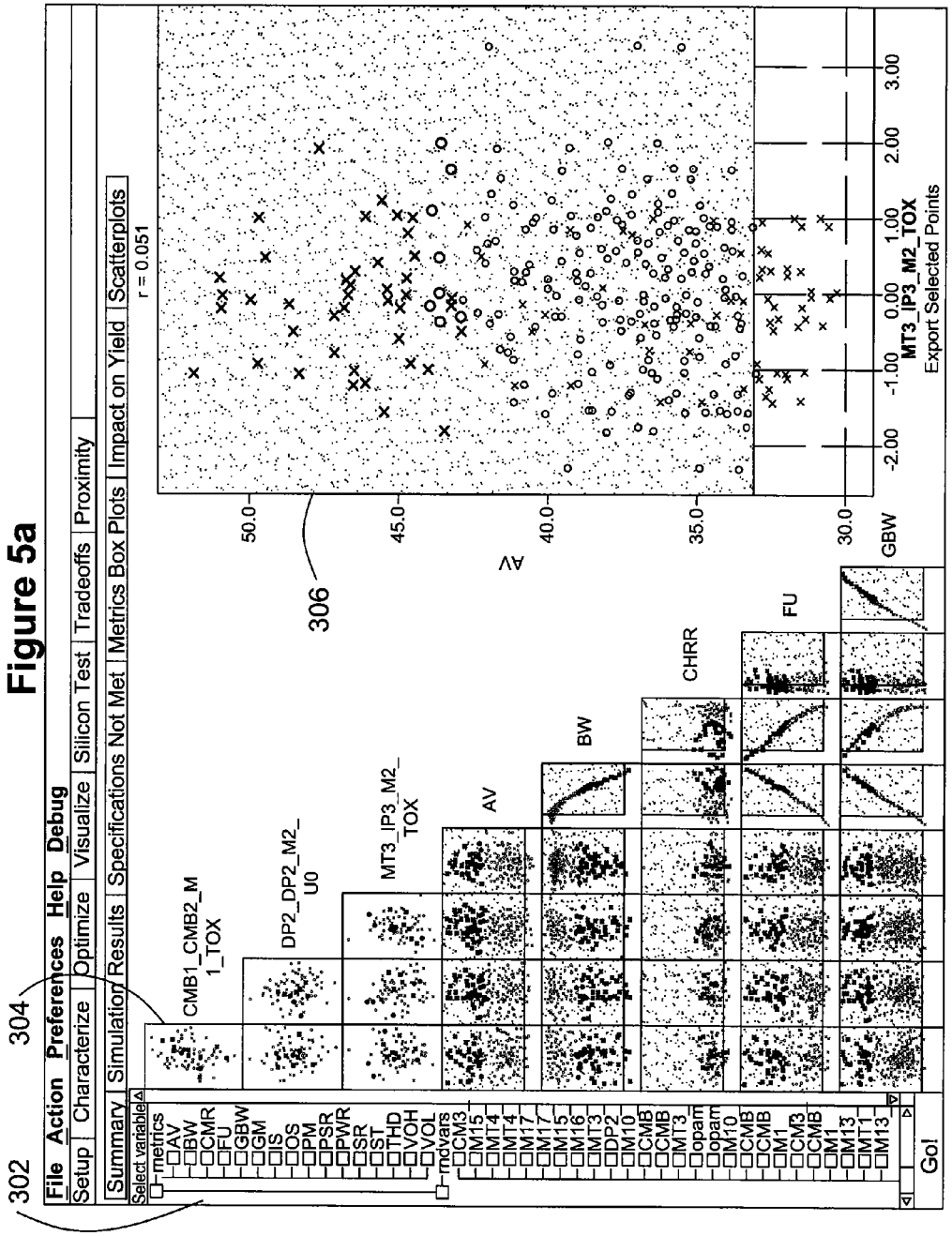
FIG. 5a shows two-dimensional scatter plots of performance metrics according to an embodiment of the present invention.
Figure 5B:
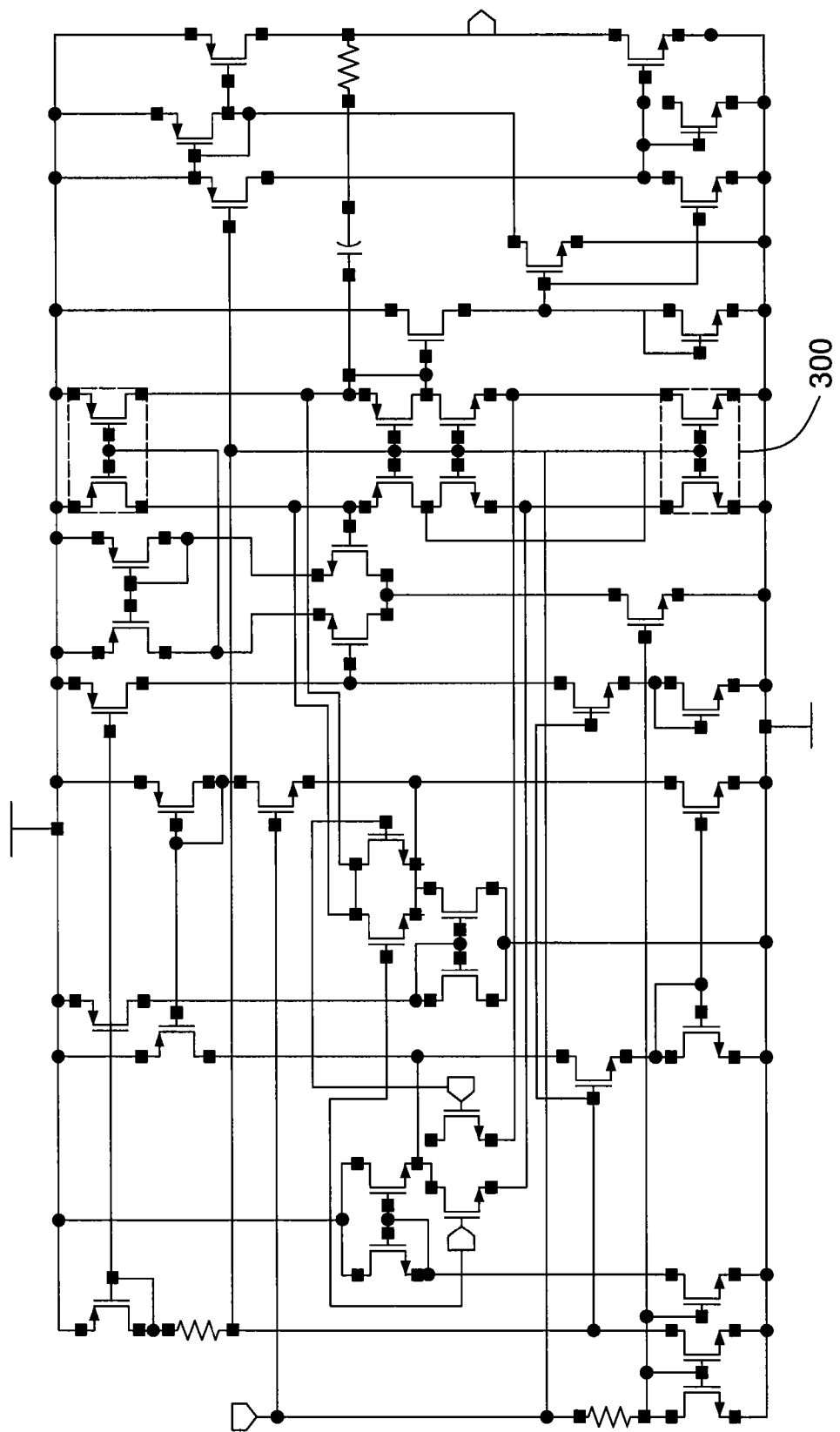

The visualization system 20 can also be used to view the results of the optimization and/or characterization. As shown in FIGS. 5a and 5b, which can also be displayed simultaneously to the user as in FIG. 2a, two-dimensional scatter plot views of different design variables and performance metrics are displayed in context of the schematic view at FIG. 5a. The user can select the design variables to display or highlight by interacting with the schematic of FIG. 5b. The interactive schematic can also be used to review component information, or view statistical information related to an element or a building block, such as, for example, by passing a pointing device cursor over the element (for example, element 300 in FIG. 5b).

In FIG. 5a, the pane 302 on the far left with a tree view of variables allows the user to select which variables to display, by clicking on the check box corresponding to the variable. These variables might be performance metrics, random variables, or other variables. In the middle is a grid 304 of small 2d scatter plots, where each scatter plot is of one of the chosen variables, versus another. Each point on the scatter plot corresponds to a specific simulation result. The large 2d scatter plot 306 on the right is a zoomed-in version of one of the small 2d scatter plots. The particular large scatter plot on the right can change based on the user's selection; the user can select which small 2d plot to zoom by merely clicking on the small 2d plot. In the large (and small) plots, the "x" points mean that the simulation is infeasible, i.e., that it did not meet the target performance specifications; whereas the "o" points are feasible. The square region with the lightly dotted background (e.g., green on a computer screen), which takes up a subset of the overall plot's background, indicates the region of feasibility for the two variables selected. Note that all points outside this region are "x" points because they are not feasible; and within the region some are "x"s because they are not feasible elsewhere, whereas others are "o"s because they are always feasible. Other examples of schematic interactivity with these plots include: the user selects a device on the schematic, and it will highlight the variables in the variable tree on the left (typically design variables or random variables); and vice versa; if the user clicks on a particular small 2d scatter plot that has 1 or 2 variables related to the schematic, then the devices related to those 1 or 2 variables will be highlighted.

Thus, interactive schematics according to the present invention can be used in systems where the relative impact of each device on manufacturing yield (aggregated data) is computed through, for example, circuit simulation software (or obtained by testing batches of corresponding manufactured circuits). The relative impact of each device on the yield can be displayed visually on the interactive schematic, such as by, for example, drawing the highest impact devices boldly, and lesser impact devices successively less boldly. In a different view, shown simultaneously with the schematic, a bar chart of the relative impact of each device on the manufacturing yield can also be shown, as described below. A view, other than the schematic view, can be used to display any value or characterization of interest. For example, bar charts showing the impact on the yield as a function of design variable, rather than by device, can be displayed. Further, the display system 32 can show the particular variables that are determined to have an association with a device or with a building block of the device. This is a great advantage over existing visualization tools where such information would be available only in table or spreadsheet form.

Figure 6:
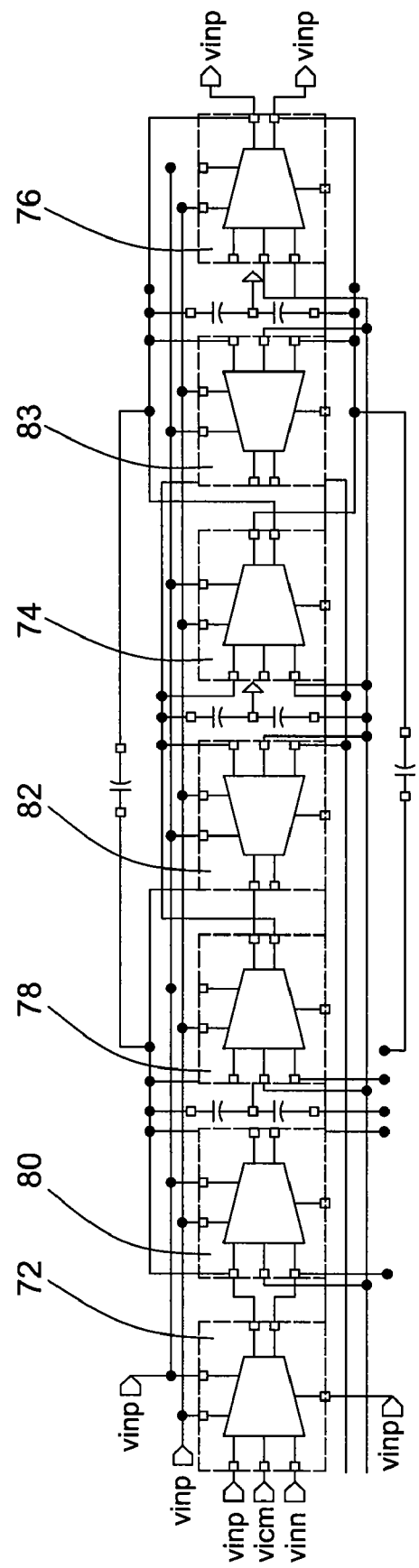
FIGS. 6-8 are hierarchical interactive schematics according to an embodiment of the present invention.
Figure 7:
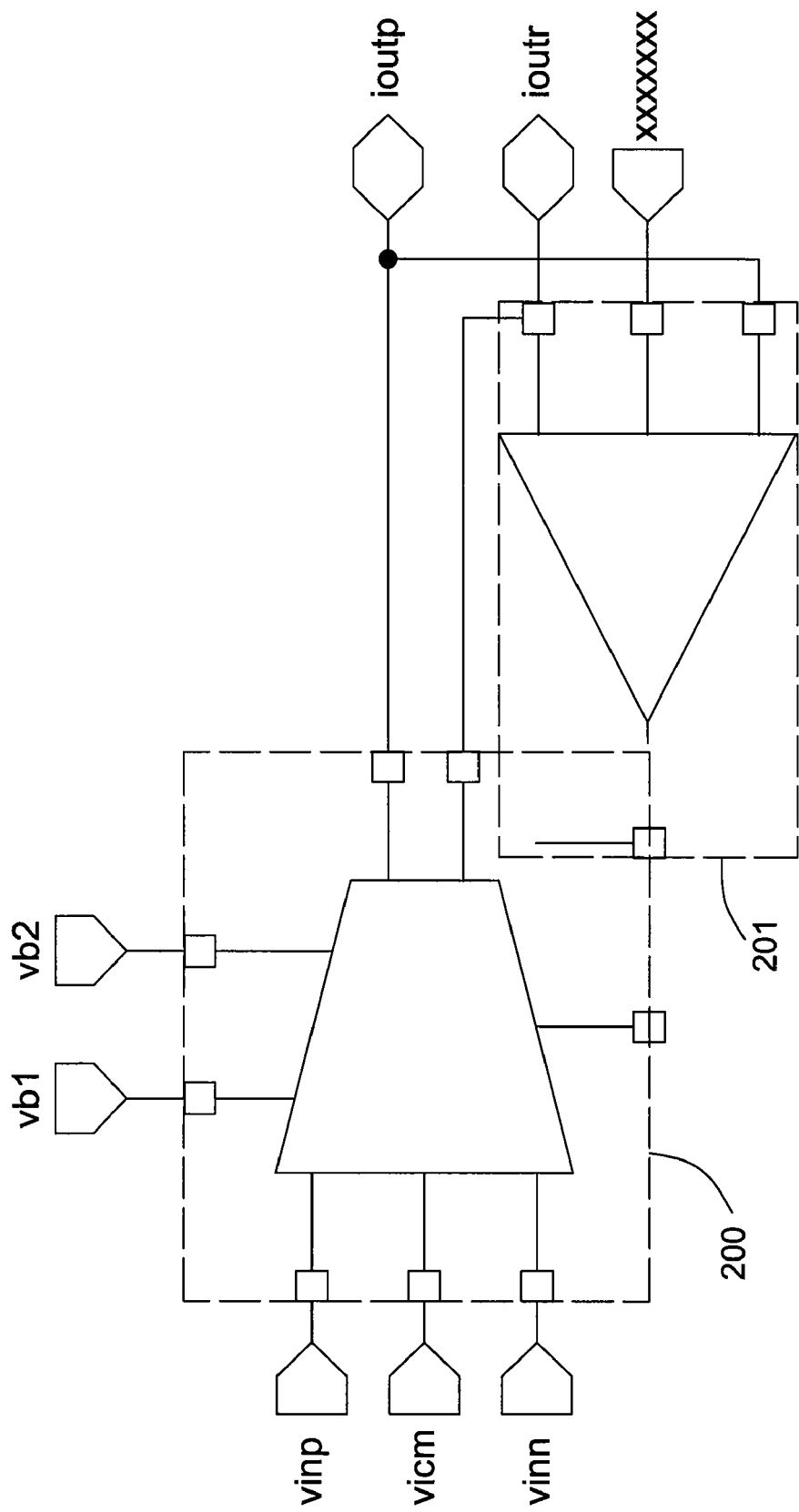
Figure 8:
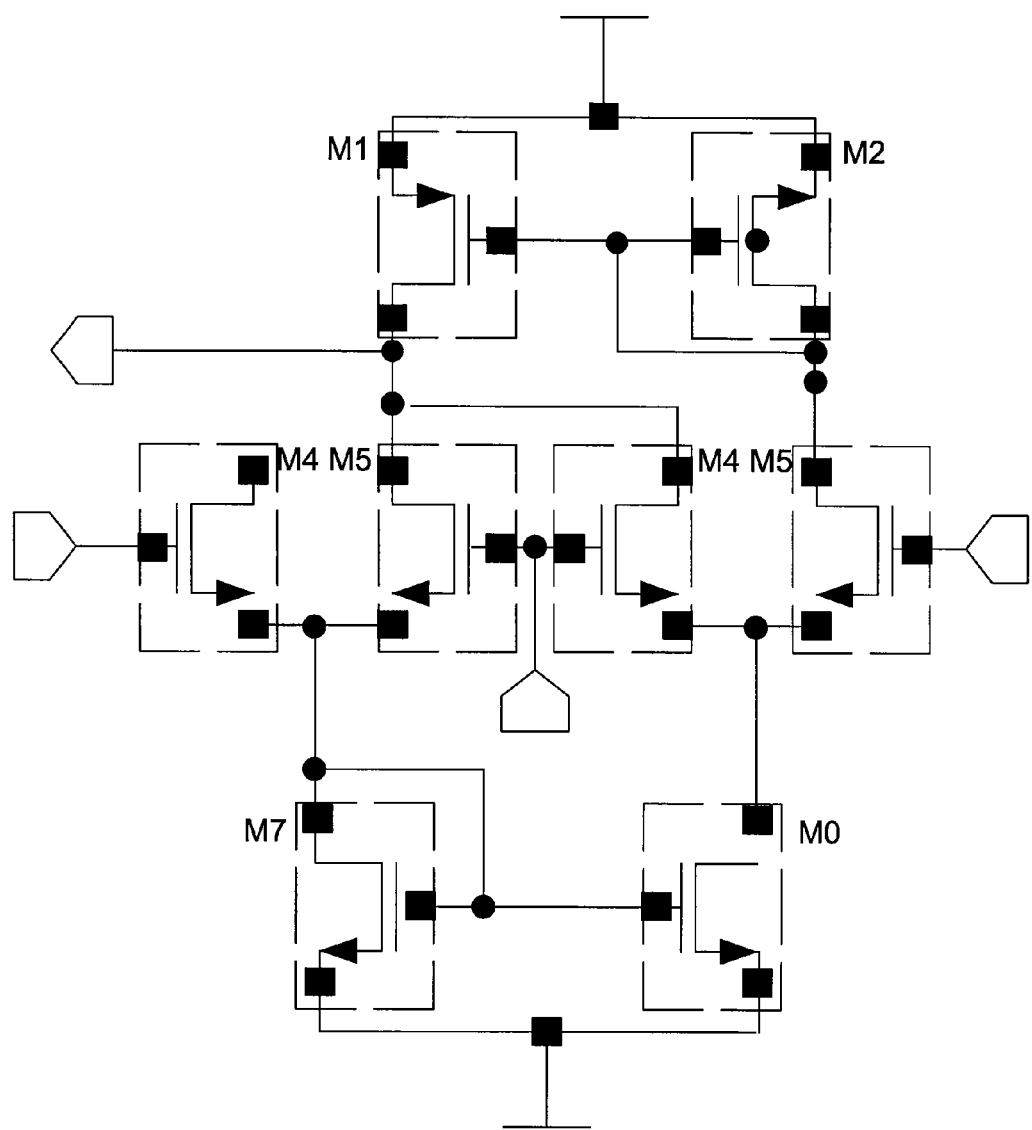

Just as many traditional schematic editors support hierarchy, an interactive schematic according to the present invention can be hierarchical in nature, such as shown at FIGS. 6-8. This hierarchical viewing capability allows the designer to dive deeper into the hierarchy, or go higher up, in a fashion similar to that of existing schematic editors. However, unlike conventional schematic editors, the interactive schematic of the present invention can display, for example, in an adjoining pane view, circuit data, such as statistical simulation data, and, in the examples of FIGS. 6-8, data related to the impact of devices on yield in a context appropriate to the level in the design hierarchy. Such additional data could be shown in the adjoining pane view as a bar chart similar to the bar chart of FIG. 2b. FIG. 6 shows a high-level circuit 70 with components 72, 74, 76, 78, 80, 82 and 83 having a decreasing impact on the yield; the relative impact of each of these devices can be represented by, for example, a pre-determined color scheme or through any other suitable visual representation approach. FIG. 7 shows a close up view of the component 72 where it is shown with component 73. FIG. 8 shows a close up view of component 72, which includes components 200 and 201. Each of FIGS. 7 and 8 can also show the relative impact of the shown components through any suitable visual representation.

As stated previously, according to embodiments of the invention, the graphic alteration, or visual representation, applied to the circuit schematic can be statistical in nature. The annotations can be derived from simulations or statistical analysis performed by the OC module 23. Further, the circuit schematic can be embedded with one or more user-selectable characterization function of the OC module 23, where a characterization function computes the impact, per circuit variable, on yield or on performance parameters. Alternatively, the schematic can be embedded with one or more optimization function of the OC module 23, where an optimization function is to suggest new design points to improve performance and/or yield of the circuit design in question. As discussed above in relation to the figures, the relative impact of a device or component on yield or performance, compared to other devices, can be shown in any number of ways. The end result is a visualization system 20 that provides better and more direct information to circuit designers, and that allows them to quickly see the impact of design decisions on a final design.

According to another embodiment of the present invention, the visualization system 20 can provide an interactive schematic for defining or viewing circuit element information, such as the variables for setting up a circuit optimization and/or characterization problem. The visualization system 20 can provide a tightly coupled schematic for viewing the setup of optimization or characterization problems. Generally, the underlying database system 24, holds information of (a) schematics, including which variables are associates to given devices, and (b) information for each variable needed for the optimization and/or characterization problem setup. The schematic can be viewed as a data structure to embed spatial information into the rest of the data, as well as graphical information. To set up the optimization and/or characterization problem, there is at least one "view" of the database available to the user—the schematic view. Of course there may be other complementary views available too, such as, for example, a table view. These views can be shown simultaneously, such as on a split screen, or can be displayed in separate windows, tables, etc.

Figure 9:
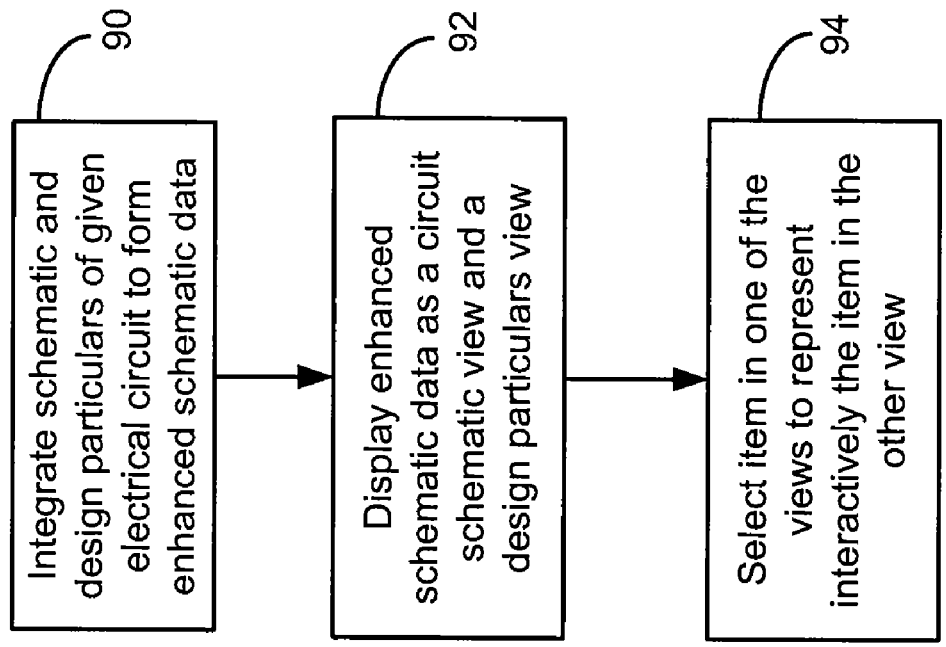
FIG. 9 shows an exemplary method of the present invention.

An exemplary method of interactive circuit design automation that can be used with the visualization system 20 is shown at FIG. 9. At step 90, for a given electrical circuit design, the schematic and the design particulars of the circuit design in question are integrated to for enhanced schematic data, which is displayed, at step 92, as a circuit schematic view and a design particulars view. At step 94, the selection of an item in one of the circuit schematic view and the design particulars view results in the interactive representation of the item in the other respective view.

In the above description, for purposes of explanation, numerous details have been set forth in order to provide a thorough understanding of the present invention. However, it will be apparent to one skilled in the art that these specific details are not required in order to practice the present invention. In other instances, well-known electrical structures and circuits are shown in block diagram form in order not to obscure the present invention. For example, specific details are not provided as to whether the embodiments of the invention described herein are implemented as a software routine, hardware circuit, firmware, or a combination thereof.

Embodiments of the invention may be represented as a software product stored in a machine-readable medium (also referred to as a computer-readable medium, a processor-readable medium, or a computer usable medium having a computer readable program code embodied therein). The machine-readable medium may be any suitable tangible medium, including magnetic, optical, or electrical storage medium including a diskette, compact disk read only memory (CD-ROM), memory device (volatile or non-volatile), or similar storage mechanism. The machine-readable medium may contain various sets of instructions, code sequences, configuration information, or other data, which, when executed, cause a processor to perform steps in a method according to an embodiment of the invention. Those of ordinary skill in the art will appreciate that other instructions and operations necessary to implement the described invention may also be stored on the machine-readable medium. Software running from the machine-readable medium may interface with circuitry to perform the described tasks.

Therefore, the invention described above is directed to a method and system for providing interactive circuit design visualization. According to embodiments of the invention, an interactive electrical circuit design visualization system displays a circuit schematic view and a design particulars view, which includes information on the particulars of the electrical circuit design in question. The system allows for the selection of an item in one of view to highlight a corresponding item in the other view. This interactive visualization system allows a designer to function much more efficiently than with prior art systems where circuit schematic views and design particulars views were independent.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A tangible computer-readable medium having recorded thereon statements and instructions executable by a computer for performing a method of interactive circuit design visualization, the method comprising:

integrating a schematic of an electrical circuit and design particulars of the electrical circuit, the electrical circuit including components and being associated with variables, the design particulars including at least one of (1)

operating ranges of the components, (2) performance data of the components, (3) performance data of a design of the electrical circuit, (4) yield data of the design of the electrical circuit, (5) data entry fields for the components, and (6) simulation data associated with the design of the electrical circuit;

displaying the schematic with the components in a circuit schematic view and the design particulars in a design particulars view;

in response to selection by a user of a component in the circuit schematic view, interactively highlighting a corresponding design particular in the design particulars view; and in response to selection by the user of a design particular in the design particulars view, interactively highlighting at least one corresponding component in the circuit schematic view.

2. The tangible computer-readable medium of claim 1 wherein, the displaying the schematic in the circuit schematic view includes displaying an indication of an impact of at least one component on at least one of a yield of the design of the electrical circuit and a performance of the design of the electrical circuit.

3. The tangible computer-readable medium of claim 2 wherein, the displaying the schematic includes displaying the indication of the impact through graphic marking of the at least one component of the electrical circuit.

4. The tangible computer-readable medium of claim 3 wherein, the displaying the indication of the impact of the at least one component includes applying a color scheme with different colors corresponding to pre-determined values of the impact.

5. The tangible computer-readable medium of claim 4 wherein, at least one graphically-marked component includes a hierarchy function selectable by a user to display information on sub-components of the at least one graphically-marked component.

6. The tangible computer-readable medium of claim 1 wherein, the displaying the schematic in the circuit schematic view includes displaying an indication of an impact of at least one variable on at least one of a yield of the design of the electrical circuit and a performance of the design of the electrical circuit.

7. The tangible computer-readable medium of claim 1 wherein, the displaying the schematic in the circuit schematic view includes displaying an indication of a sensitivity of at least one component on at least one of a yield of the design of the electrical circuit and a performance of the design of the electrical circuit.

8. The tangible computer-readable medium of claim 7 wherein, the displaying the schematic includes displaying the indication of the sensitivity through graphic marking of the at least one component of the electrical circuit.

9. The tangible computer-readable medium of claim 8 wherein, the displaying the indication of the sensitivity of the at least one component includes applying a color scheme with different colors corresponding to pre-determined values of the sensitivity.

10. The tangible computer-readable medium of claim 9 wherein, at least one graphically-marked component includes a hierarchy function selectable by a user to display information on sub-components of the at least one graphically-marked component.

11. The tangible computer-readable medium of claim 1 wherein, the displaying the schematic in the circuit schematic view includes displaying an indication of a sensitivity of at least one variable on at least one of a yield of the design of the electrical circuit and a performance of the design of the electrical circuit.

12. The tangible computer-readable medium of claim 1 wherein, the design particulars view includes at least one item with statistical data relating at least one component of the electrical circuit to the yield data of the design of the electrical circuit.

13. The tangible computer-readable medium of claim 12 wherein, the statistical data includes at least one of a histogram, a scatter plot and a yield curve.

14. The tangible computer-readable medium of claim 1 wherein, the circuit schematic view includes a view of the schematic of the electrical circuit with at least one component of the electrical circuit, the at least one component being graphically-marked and associated with at least one of an optimization function and a characterization function, the step of interactively highlighting a corresponding design particular in the design particulars view including a step of performing at least one of an optimization and a characterization of the graphically-marked component.

15. An interactive electrical circuit design visualization system for performing an electrical circuit design having components and being associated with variables, the visualization system comprising:

a circuit schematic module including a schematic of the electrical circuit design;

a circuit particulars module including design particulars of the electrical circuit design, the design particulars including at least one of (1) operating ranges of the components, (2) performance data of the components, (3) performance data of the electrical circuit design, (4) yield data of the electrical circuit design, (5) data entry fields for the components, and (6) simulation data associated with the electrical circuit design;

an integration module operatively connected to the circuit schematic module and to the circuit particulars module, the integration module for integrating the schematic of the electrical circuit design with the design particulars to form enhanced schematic data;

a display system operatively connected to the integration module to display the enhanced schematic data as a circuit schematic view and a design particulars view; and a user input module for selecting a component in the circuit schematic view to highlight interactively at least one corresponding design particular in the design particulars view, the input module also for selecting a design particular in the design particulars view to highlight interactively at least one corresponding component in the schematic view.

* * * * *